United States Patent [19]
Nishino

[11] Patent Number: 5,835,044
[45] Date of Patent: Nov. 10, 1998

[54] 1-BIT A/D CONVERTING DEVICE WITH REDUCED NOISE COMPONENT

[75] Inventor: Ayataka Nishino, Kanagawa, Japan

[73] Assignee: Sony Corporation, Tokyo, Japan

[21] Appl. No.: 839,571

[22] Filed: Apr. 15, 1997

[30] Foreign Application Priority Data

Apr. 23, 1996 [JP] Japan ................................. 8-101451

[51] Int. Cl.$^6$ ................................................. H03M 3/00
[52] U.S. Cl. ................................................. 341/143
[58] Field of Search ..................................... 341/143

[56] References Cited

U.S. PATENT DOCUMENTS 5,150,120  9/1992  Yumus ................................. 341/143
5,363,101  11/1994  Ueki ................................... 341/143

FOREIGN PATENT DOCUMENTS 6-209266  7/1994  Japan .
7-249988  9/1995  Japan .

Primary Examiner—Howard L. Williams
Attorney, Agent, or Firm—Jay H. Maioli

[57] ABSTRACT

In a 1-bit A/D converting circuit for converting an analog input signal to a 1-bit digital signal according to the present invention, a plurality of 1-bit $\Sigma\Delta$ modulators are connected in parallel so that outputs of the 1-bit $\Sigma\Delta$ modulators are added and converted to a multi-bit signal, which is then passed through another 1-bit $\Sigma\Delta$ modulator. Thus, the noise component is reduced.

4 Claims, 7 Drawing Sheets

1-BIT A/D CONVERTING DEVICE WITH REDUCED NOISE COMPONENT

FIELD OF THE INVENTION

This invention relates to a signal processing device having a function similar to a 1-bit sigma-delta ($\Sigma\Delta$) modulation analog-to-digital (A/D) converter which is adapted for performing sigma-delta modulation of an analog input signal so as to output a 1-bit digital signal.

2. Background of the Invention

In a conventional 1-bit $\Sigma\Delta$ modulation A/D converter, an analog integrator constituted by a combination of an operational amplifier and a capacitor is employed as an integrator inside the converter to carry out analog noise shaping.

FIG. 1 shows a specific structure of the conventional 1-bit $\Sigma\Delta$ modulation A/D converter. An analog input signal from a sound source 31 is supplied to an inversion input terminal (−) of an operational amplifier 33 via a resistor 32. An output of a 1-bit digital-to-analog (D/A) converter 34 is also supplied to the inversion input terminal (−) of the operational amplifier 33 via a resistor 35.

A capacitor 36 is inserted between the inversion input terminal (−) and the output of the operational amplifier 33, thus constituting an inversion type integrator in its entirety. A voltage obtained by integrating a differential current between the input signal and a feedback 1-bit signal is outputted from the operational amplifier 33 and supplied to a comparator 37.

The comparator 37 outputs "1" to a D-latch 38 when the output of the operational amplifier 33 is not smaller than 0 V, while it outputs "0" to the D-latch 38 when the output of the operational amplifier 33 is smaller than 0 V.

The D-latch 38 latches the output of the comparator 37 for every sampling frequency by a sampling clock supplied from a clock terminal 39. The D-latch 38 outputs the latched signal as a 1-bit $\Sigma\Delta$ modulated signal. The D-latch 38 also controls, with its output, the output of the 1-bit D/A converter 34.

The 1-bit D/A converter 34 outputs "+α V" when the output of the D-latch 38 is "1", while it outputs "−α V" when the output of the D-latch 38 is "0".

With the conventional 1-bit $\Sigma\Delta$ modulation A/D converter 30, restrictions of the analog circuit and components, such as, residual noise and distortion of the operational amplifier or accuracy and high-frequency characteristic of the capacitor, causes difficulty in obtaining ideal noise shaping characteristic and signal-to-noise (S/N) ratio as designed.

In view of the foregoing status of the art, it is an object of the present invention to provide a signal processing device whereby characteristics proximate to ideal characteristics as designed can be obtained.

SUMMARY OF THE INVENTION

According to the present invention, there is provided a 1-bit A/D converter having: a data converter including m units of n-bit sigma-delta modulators connected in parallel for converting an analog input signal to an n-bit digital signal, where n is an integer equal to or greater than 1 and m is an integer equal to or greater than 1; an adder for adding m units of n-bit digital data of the m units of n-bit sigma-delta modulators constituting the data converter; and a 1-bit sigma-delta modulator for re-converting an addition output from the adder to a 1-bit digital signal.

DESCRIPTION OF THE PREFERRED EMBODIMENTS

Preferred embodiments of the signal processing device according to the present invention will now be described in detail.

Figure 2:
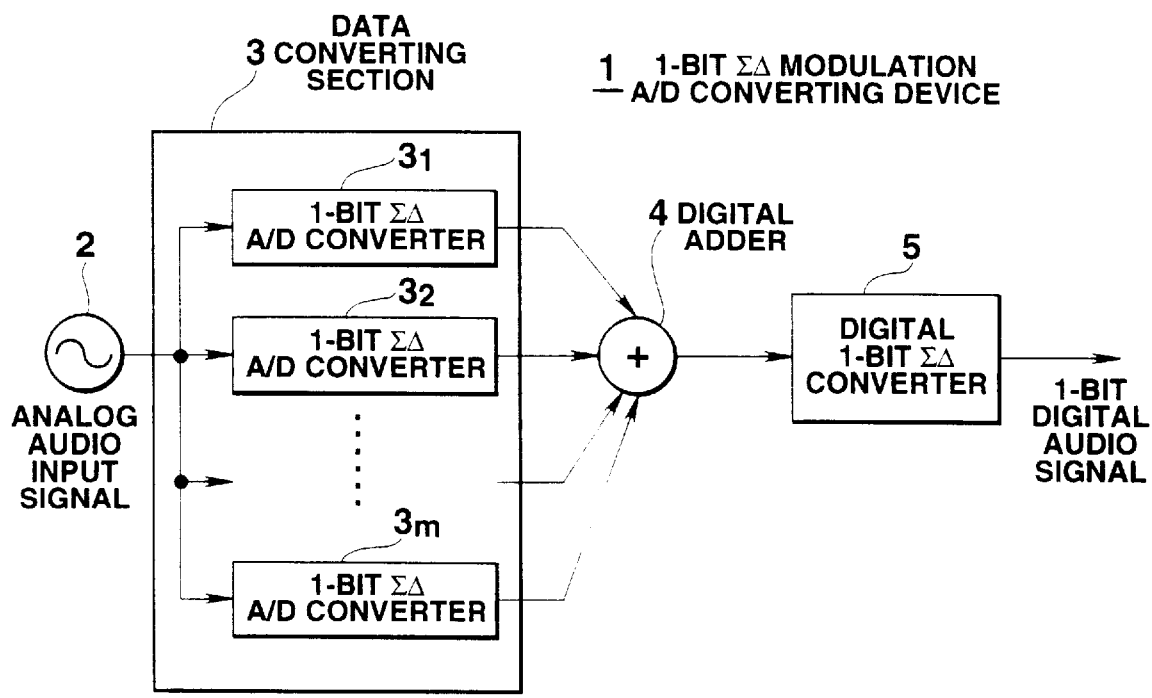
FIG. 2 is a block diagram showing a 1-bit $\Sigma\Delta$ modulation A/D converter having m units of 1-bit $\Sigma\Delta$ modulators connected in parallel according to a first embodiment of the present invention.

A first embodiment is explained. The first embodiment of the present invention is a 1-bit sigma-delta (ΣΔ) modulation analog-to-digital (A/D) converting device 1 for converting an analog audio input signal to a 1-bit digital audio signal, as shown in FIG. 2.

This 1-bit ΣΔ modulation A/D converting device 1 has a data converting section 3 in which m units of 1-bit ΣΔ A/D converters $3_1, 3_2, \ldots 3_m$ for converting an analog audio input signal from a sound source 2 to a 1-bit digital signal are connected in parallel. The 1-bit ΣΔ modulation A/D converting device 1 also has a digital adder 4 for adding m units of 1-bit digital signals from the data converting section 3, and a digital 1-bit ΣΔ converter 5 for converting an m-bit digital signal from the digital adder 4 to a 1-bit digital signal.

Figure 1:
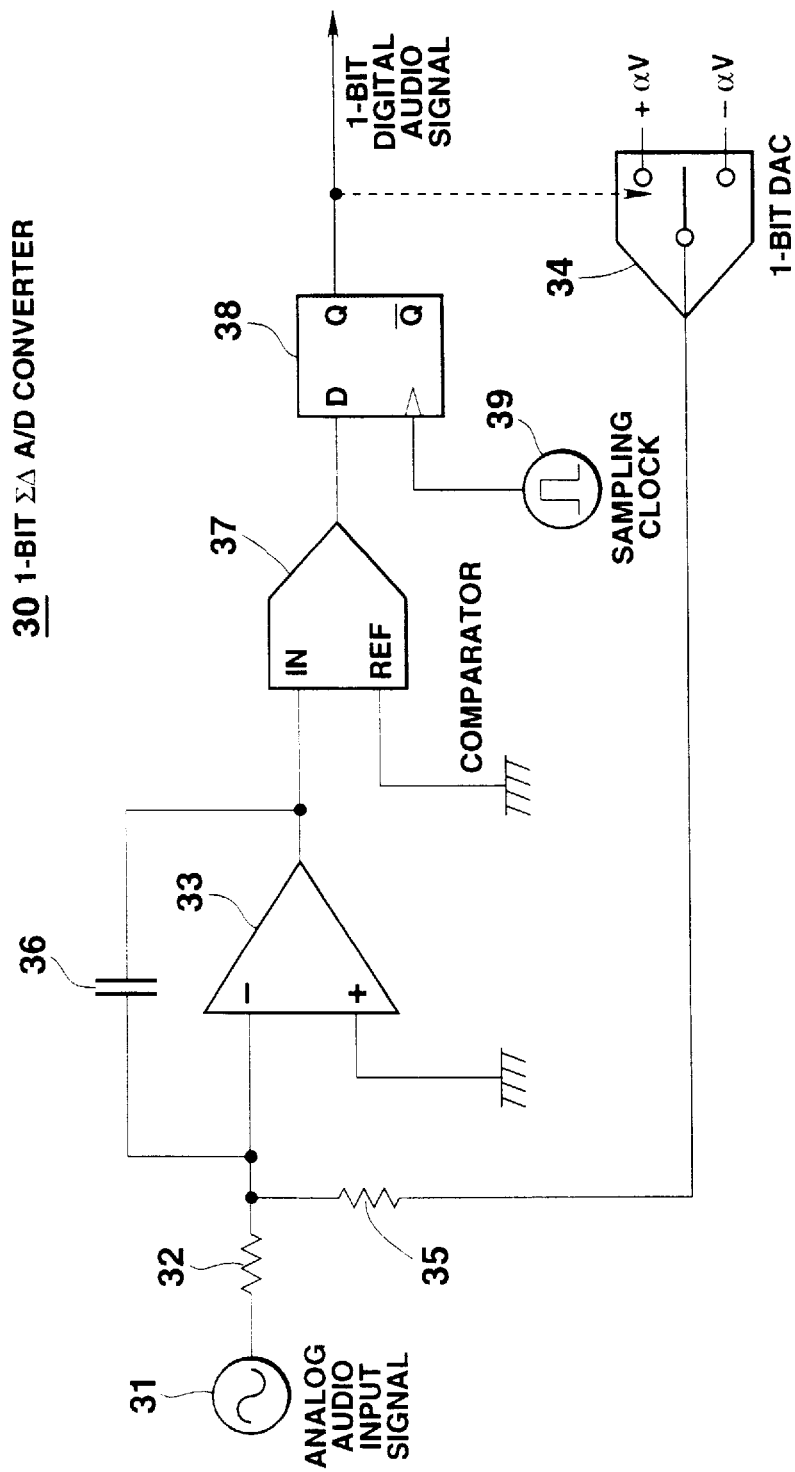
FIG. 1 is a block diagram showing a 1-bit $\Sigma\Delta$ modulation A/D converter for converting an analog input signal to a 1-bit digital signal.

Each of the m units of 1-bit ΣΔ A/D converters $3_1, 3_2, \ldots 3_m$ connected in parallel in the data converting section 3 converts an analog input signal to a 1-bit digital signal. The structure of the 1-bit ΣΔ A/D converter is as shown in FIG. 1.

Figure 3:
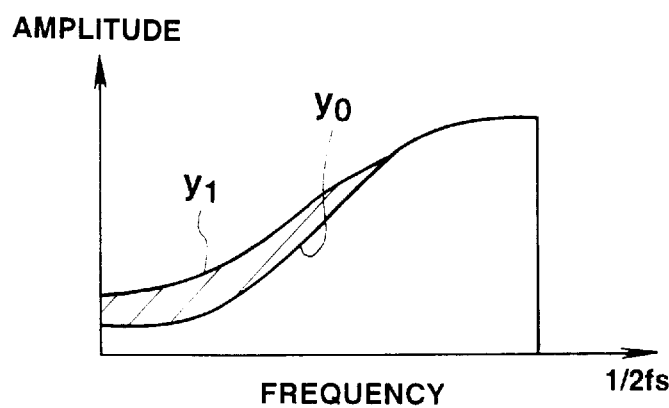
FIG. 3 is a graph showing frequency characteristic by comparing ideal characteristic y0 and actual characteristic y1 of a noise component of the $\Sigma\Delta$ modulator.

If all the components of one of the 1-bit ΣΔ A/D converters are constituted by an ideal resistor, an ideal capacitor and an ideal operational amplifier, the noise characteristic showing the amplitude of the noise with respect to the frequency is as shown by y0 in FIG. 3. In reality, however, with the resistor, the capacitor and the operational amplifier, distortion and noise are generated by non-linearity characteristic in a high-frequency range. Thus, the actual noise characteristic is as shown by y1.

In the 1-bit ΣΔ modulation A/D converting device 1 of the first embodiment, the m units of 1-bit digital signal outputs from the m units of 1-bit ΣΔ A/D converters $3_1, 3_2, \ldots 3_m$ having such noise characteristic are added by the digital adder 4 to be an m-bit digital audio signal, which is inputted to the 1-bit ΣΔ converter 5.

Through the addition by the digital adder 4, an audio signal becomes m times the 1-bit digital audio signal of one 1-bit ΣΔ A/D converter. On the contrary, in adding noise components by the digital adder 4, the noise components of the 1-bit ΣΔ A/D converters $3_1, 3_2, \ldots 3_m$ differ in phase from each other like white noise. Therefore, the noise component become √m times the noise component of one 1-bit ΣΔ A/D converter.

Figure 4:
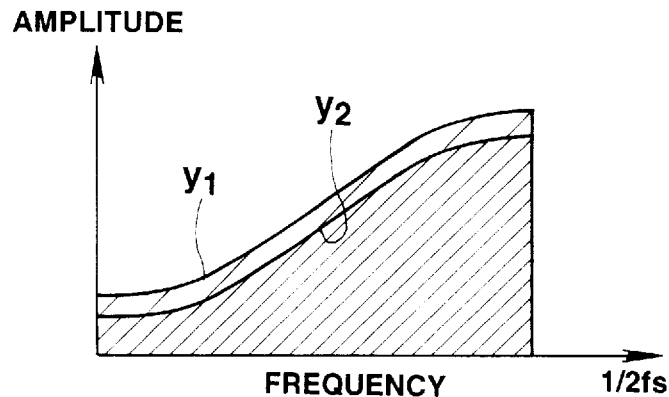
FIG. 4 is a graph showing frequency characteristic of a noise component of an output signal from a digital adder 4 obtained by adding output signals from a data converting section 3 having m units of 1-bit $\Sigma\Delta$ modulators connected in parallel according to the first embodiment of the present invention.

For this reason, the noise of the m-bit digital signal as the output of the digital adder 4 with respect to the audio signal is reduced relatively to 1/√m, and hence has noise characteristic as shown by y2 in FIG. 4.

For instance, in the case where the data converting section has 16 1-bit ΣΔ A/D converters so that 16 1-bit digital signals are added by the digital adder, the noise of a 16-bit digital signal as an addition output of the digital adder with respect to the audio signal is reduced relatively to ¼.

Figure 5:
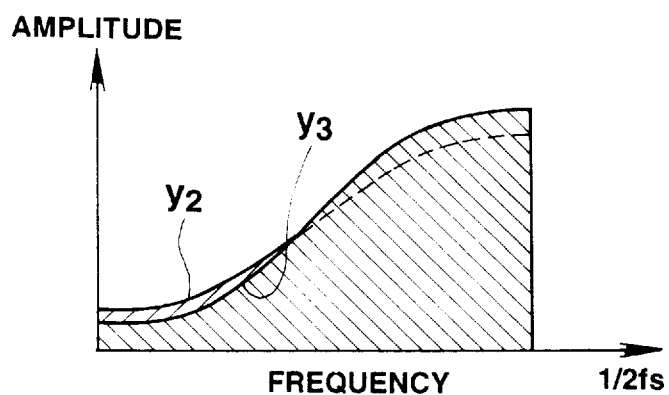
FIG. 5 is a graph showing frequency characteristic of noise characteristic y3 of a 1-bit $\Sigma\Delta$ converter 5 itself for re-converting an m-bit digital signal from the digital adder 4 to a 1-bit digital signal according to the first embodiment of the present invention.

The m-bit digital signal with its signal-to-noise (S/N) ratio thus improved is inputted to the digital 1-bit ΣΔ converter 5. Since the entire digital 1-bit ΣΔ converter 5 including its inner integrator is constituted by a digital signal processing structure, it is not affected by elements and circuits unlike the 1-bit ΣΔ A/D converters $3_1, 3_2, \ldots 3_m$ constituting the inside of the analog circuit. Thus, the digital 1-bit ΣΔ converter 5 has noise characteristic as shown by y3 in FIG. 5.

Figure 6:
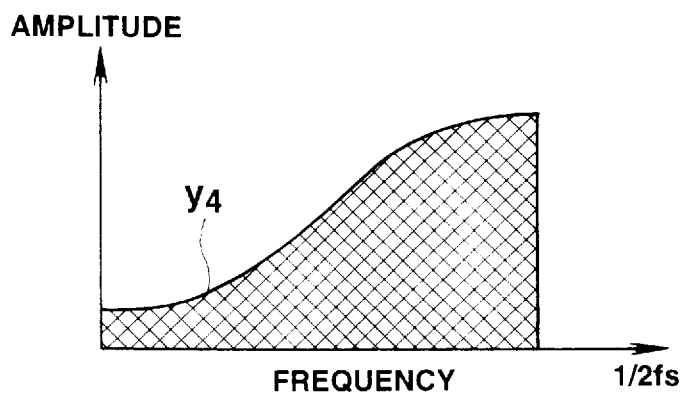
FIG. 6 is a graph showing frequency characteristic of noise characteristic y4 of an output signal of the 1-bit $\Sigma\Delta$ converter 5 for re-converting an m-bit digital signal from the digital adder 4 to a 1-bit digital signal according to the first embodiment of the present invention.

As the digital 1-bit ΣΔ converter 5 performs ΣΔ modulation of the m-bit digital signal having the above-described noise characteristic of y2, the noise characteristic of the 1-bit digital signal outputted by the digital 1-bit ΣΔ converter 5 becomes like y4 in FIG. 6.

The noise characteristic of the 1-bit digital signal outputted by the digital 1-bit ΣΔ converter 5 becomes more proximate to the ideal noise characteristic y0 shown in FIG. 3.

Thus, in the 1-bit ΣΔ modulation A/D converting device 1 of the first embodiment, since the 1-bit digital signals of the m units of 1-bit ΣΔ A/D converters $3_1, 3_2 \ldots 3_m$ connected in parallel are added by the digital adder 4 to be the m-bit digital signal with improved S/N ratio, which is then converted to the 1-bit digital signal by the digital 1-bit ΣΔ converter 5, A/D conversion with characteristic proximate to the ideal characteristic as designed which cannot be obtained by a single 1-bit ΣΔ A/D converter is realized.

The data converting section 3 may have an integer number of 1-bit ΣΔ A/D converters connected in parallel, with the integer number being equal to or greater than 1, for example, 4 or 32 1-bit ΣΔ A/D converters, instead of the above-described 16 (=m) 1-bit ΣΔ A/D converters connected in parallel.

Figure 7:
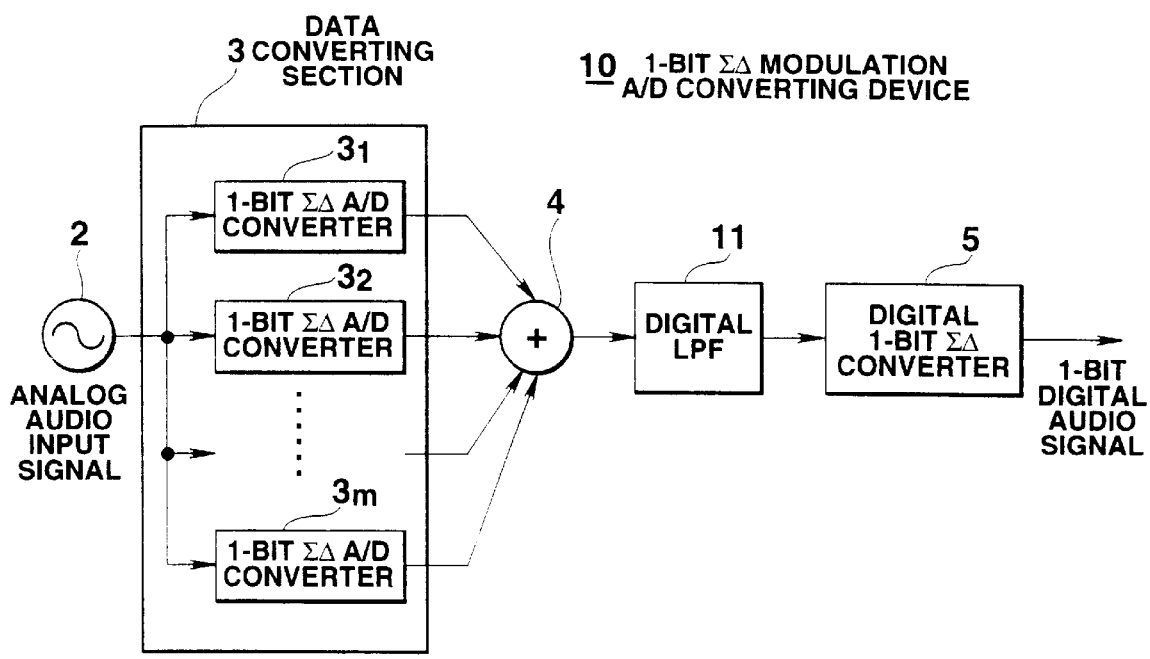
FIG. 7 is a block diagram showing a 1-bit $\Sigma\Delta$ modulation A/D converter having m units of 1-bit $\Sigma\Delta$ modulators connected in parallel according to a second embodiment of the present invention.

A second embodiment is now explained. The second embodiment is also a 1-bit ΣΔ modulation A/D converting device 10 for converting an analog audio input signal to a 1-bit digital audio signal, as shown in FIG. 7.

This 1-bit ΣΔ modulation A/D converting device 10 differs from the 1-bit ΣΔ modulation A/D converting device 1 of the first embodiment in that a digital low-pass filter 11 is inserted between a digital adder 4 and a digital 1-bit ΣΔ converter 5.

In the 1-bit ΣΔ modulation A/D converting device 10, an m-bit digital signal from the digital adder 4 is passed through the digital low-pass filter 11 so as to reduce the noise component in the high-frequency range, and is then supplied to the digital 1-bit ΣΔ converter 5.

An analog audio signal from a sound source 2 is supplied to m units of 1-bit ΣΔ A/D converters $3_1, 3_2, \ldots 3_m$ connected in parallel to constitute a data converting section 3. 1-bit digital signal outputs of the 1-bit ΣΔ A/D converters $3_1, 3_2, \ldots 3_m$ are added by the digital adder to be converted to a multi-bit digital signal of m bits.

Through this addition, the audio signal becomes m times the input signal while the quantization noise of ΣΔ modulation is only √m times. Therefore, the S/N ratio is reduced relatively to 1/√m.

Thus, by passing the multi-bit digital signal of m bits with improved S/N ratio through the digital low-pass filter 11 to reduce the quantization noise in the high-frequency range and thereby to prevent saturation of the digital 1-bit ΣΔ converter 5 on the subsequent stage, it is possible to realize 1-bit ΣΔ A/D conversion with a high degree of stability and characteristic proximate to the ideal characteristic at the time of entering a large input.

Meanwhile, depending upon the structure of the low-pass filter for reducing the quantization noise in the high-frequency range, the hardware structure may be more simplified by inserting the low-pass filter between each of the 1-bit ΣΔ A/D converters and the digital adder 4.

Figure 8:
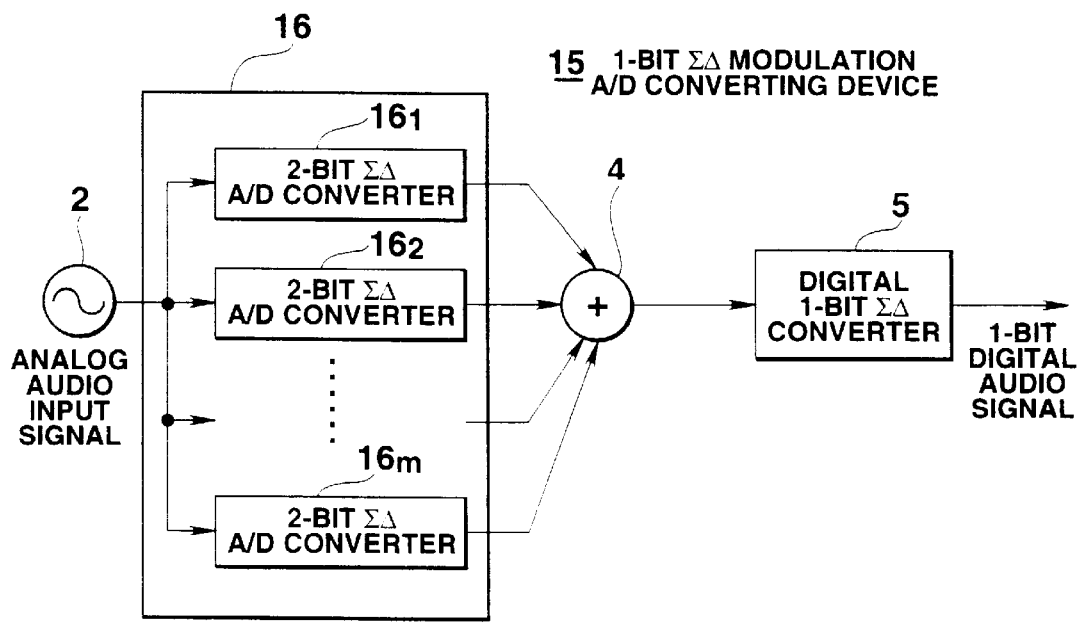
FIG. 8 is a block diagram showing a 1-bit $\Sigma\Delta$ modulation A/D converter having m units of 2-bit $\Sigma\Delta$ modulators connected in parallel according to a third embodiment of the present invention.

A third embodiment is now explained. The third embodiment is also a 1-bit ΣΔ modulation A/D converting device 15 for converting an analog audio input signal to a 1-bit digital audio signal, as shown in FIG. 8.

This 1-bit ΣΔ modulation A/D converting device 15 differs from the 1-bit ΣΔ modulation A/D converting device 1 of the first embodiment in that a data converting section 16 is constituted by plural m units of 2-bit ΣΔ A/D converters $16_1, 16_2, \ldots 16_m$ connected in parallel.

That is, in the 1-bit ΣΔ modulation A/D converting device 15, an input analog audio signal from a sound source 2 is inputted to the data converting section 16 constituted by the m units of 2-bit ΣΔ A/D converters connected in parallel.

2-bit digital signals outputted from the 2-bit ΣΔ A/D converters $16_1, 16_2, \ldots 16_m$ are added by a digital adder 4 to be converted to multi-bit digital data of 2m bits. The multi-bit digital data of 2m bits is converted to a 1-bit digital signal by a digital 1-bit ΣΔ converter 5.

In the 1-bit ΣΔ modulation A/D converting device 15 of the third embodiment, the noise component with respect to the audio signal can be more reduced than the 2-bit digital signal outputted by a single 2-bit ΣΔ A/D converter.

Therefore, in the 1-bit ΣΔ modulation A/D converting device 15, too, 1-bit A/D conversion with characteristic proximate to the ideal characteristic can be realized.

Figure 9:
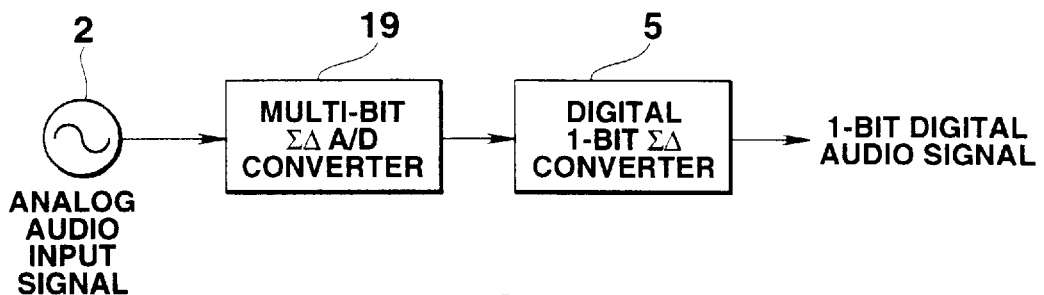
FIG. 9 is a block diagram showing a 1-bit $\Sigma\Delta$ modulation A/D converter in which an output of a multi-bit $\Sigma\Delta$ A/D converter is connected to a digital 1-bit $\Sigma\Delta$ converter according to a fourth embodiment of the present invention.

A fourth embodiment is now explained. The fourth embodiment is also a 1-bit ΣΔ modulation A/D converting device 18 for converting an analog audio input signal to a 1-bit digital audio signal, as shown in FIG. 9.

This 1-bit ΣΔ modulation A/D converting device 18 has a multi-bit ΣΔ A/D converter 19 for converting an analog audio input signal to a p-bit digital signal, where p is an integer equal to or greater than 2, and a digital 1-bit ΣΔ converter 5 for converting the p-bit digital signal output of the multi-bit digital ΣΔ A/D converter 19 to a 1-bit digital signal.

With the multi-bit digital ΣΔ A/D converter 19, the linearity of distortion factor at the time of handling a large amplitude is slightly deteriorated compared with that of the 1-bit ΣΔ A/D converter of the same degree. However, since the S/N ratio is improved in accordance with the number of bits, the multi-bit digital ΣΔ A/D converter 19 is more advantageous than a large number of 1-bit ΣΔ A/D converters connected in parallel.

Figure 10:
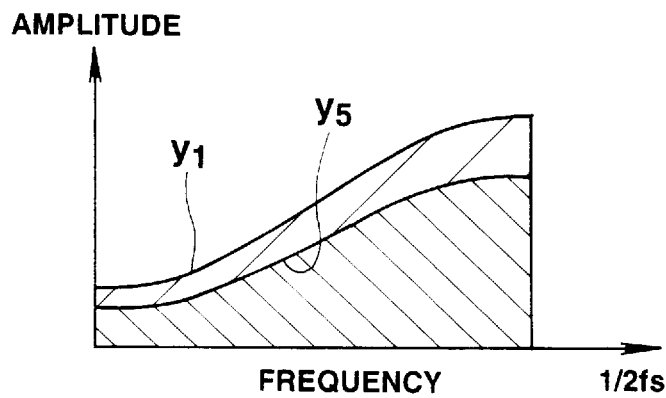
FIG. 10 is a graph showing frequency characteristic of noise characteristic y5 of a multi-bit $\Sigma\Delta$ A/D converter 19 itself according to the fourth embodiment of the present invention.

An analog audio signal from a sound source 2 is inputted to the multi-bit digital ΣΔ A/D converter 19. Although the multi-bit digital ΣΔ A/D converter has the noise characteristic as shown by y5 in FIG. 10 with the linearity of distortion factor slightly deteriorated as described above, the S/N ratio can be improved in accordance with the number of bits.

Figure 11:
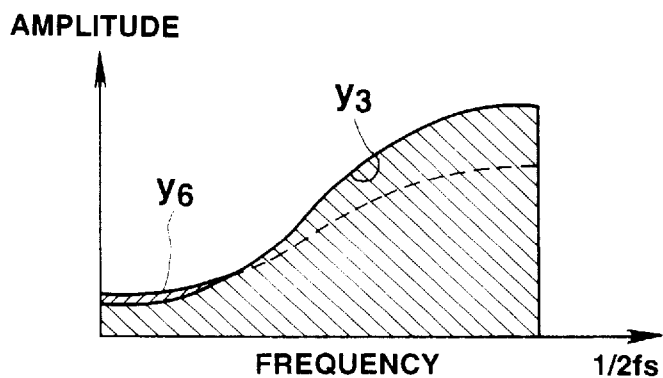
FIG. 11 is a graph showing frequency characteristic of noise characteristic y3 of the 1-bit $\Sigma\Delta$ converter 5 itself according to the fourth embodiment of the present invention.

Since the entire digital 1-bit ΣΔ converter 5 including its inner integrator is constituted by a digital signal processing structure, it is not affected by elements and circuits unlike the 1-bit ΣΔ A/D converters constituting the inside of the analog circuit. Thus, the digital 1-bit ΣΔ converter 5 has noise characteristic as shown by y3 in FIG. 11.

Figure 12:
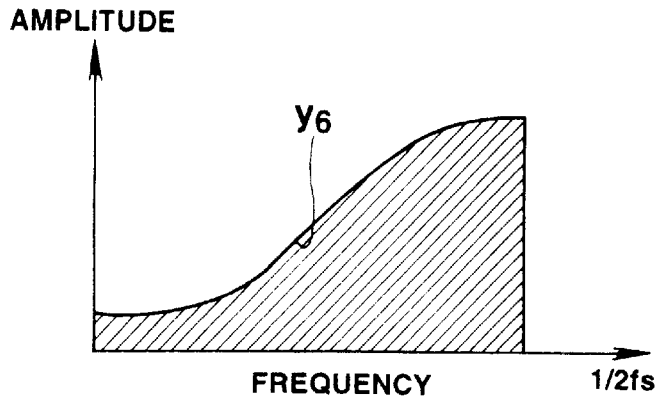
FIG. 12 is a graph showing frequency characteristic of noise characteristic y6 of a 1-bit digital output signal of the 1-bit $\Sigma\Delta$ modulation A/D converter, in which the output of the multi-bit $\Sigma\Delta$ A/D converter is connected to the digital 1-bit $\Sigma\Delta$ converter according to the fourth embodiment of the present invention.

As the digital 1-bit ΣΔ converter 5 performs ΣΔ modulation of the p-bit digital signal having the above-described noise characteristic of y5, the noise characteristic of the 1-bit digital signal outputted by the digital 1-bit ΣΔ converter 5 becomes like y6 in FIG. 12.

That is, the noise characteristic of the 1-bit digital signal outputted by the digital 1-bit ΣΔ converter 5 becomes more proximate to the ideal noise characteristic y0 shown in FIG. 3.

Thus, in the 1-bit ΣΔ modulation A/D converting device 18 of the fourth embodiment, since the multi-bit digital signal of p bits from the multi-bit ΣΔ A/D converter 19 which is capable of improving the S/N ratio in accordance with the number of bits is converted to the 1-bit digital signal by the digital 1-bit ΣΔ converter 5, A/D conversion with characteristic proximate to the ideal characteristic which cannot be obtained by a single 1-bit ΣΔ A/D converter is realized.

Figure 13:
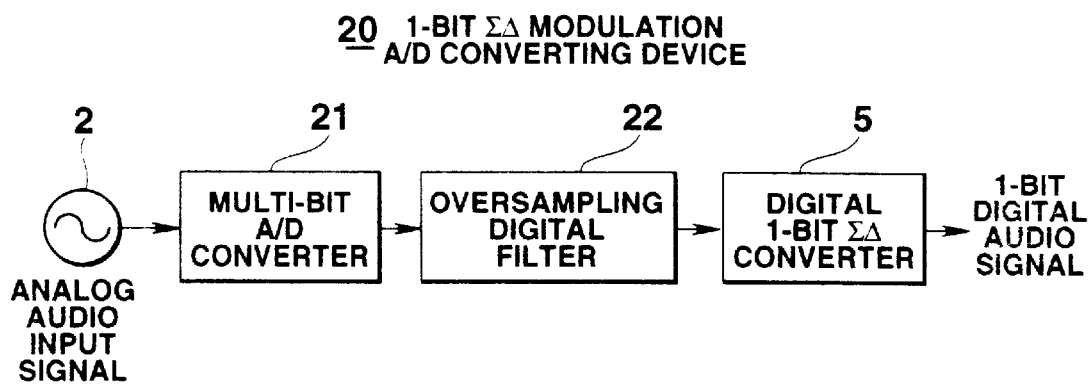
FIG. 13 is a block diagram showing a fifth embodiment of the present invention, in which an oversampling digital filter 22 is added between the multi-bit $\Sigma\Delta$ A/D converter and the 1-bit $\Sigma\Delta$ converter of the fourth embodiment.

A fifth embodiment is now explained. The fifth embodiment is also a 1-bit ΣΔ modulation A/D converting device 20 for converting an analog audio input signal to a 1-bit digital audio signal, as shown in FIG. 13.

The 1-bit ΣΔ modulation A/D converting device 20 has a multi-bit A/D converter 21 for converting an analog audio input signal to a multi-bit signal by a sampling frequency fe. The 1-bit ΣΔ modulation A/D converting device 20 also has a oversampling digital filter 22 for oversampling an output of the multi-bit A/D converter 21 with the sampling frequency fs, and a digital 1-bit ΣΔ converter 5 for converting a multi-bit output signal from the oversampling digital filter 22 to a 1-bit digital signal.

The sampling frequency fs is integer times a sampling frequency 44.1 KHz, for example, used for PCM modulation. The sampling frequency fe may be 44.1 KHz, for example.

An analog audio signal from a sound source 2 is inputted to the multi-bit A/D converter 21. The multi-bit converter 21 converts the input analog audio signal to a digital signal by a sampling frequency lower than the sampling frequency fs.

Figure 14:
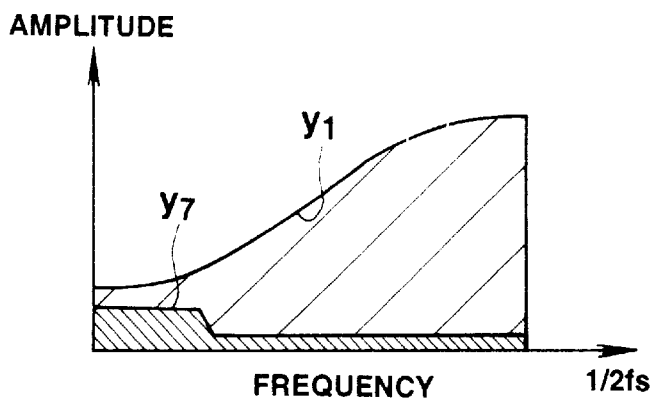
FIG. 14 is a graph showing frequency characteristic of noise characteristic y7 of an output signal from the oversampling digital filter 22 of the fifth embodiment.

The oversampling digital filter 22 uses the sampling frequency fe of the digital signal from the multi-bit A/D converter 21 as the normal sampling frequency fs. In this case, the noise characteristic of the digital signal outputted from the oversampling digital filter 22 is as shown by y7 in FIG. 14.

Figure 15:
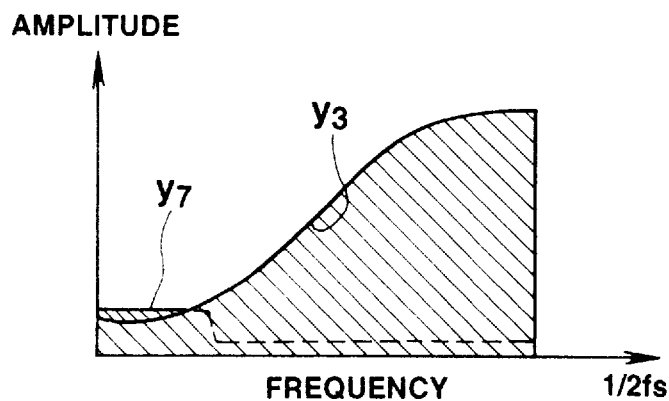
FIG. 15 is a graph showing frequency characteristic of noise characteristic y3 of the 1-bit $\Sigma\Delta$ converter 5 itself of the fifth embodiment.

Since the entire digital 1-bit ΣΔ converter 5 including its inner integrator is constituted by a digital signal processing structure, it is not affected by elements and circuits unlike the 1-bit ΣΔ A/D converters constituting the inside of the analog circuit. Thus, the digital 1-bit ΣΔ converter 5 has noise characteristic as shown by y3 in FIG. 15.

Figure 16:
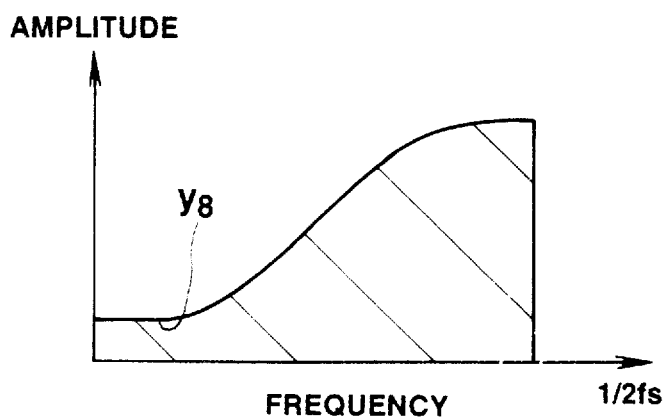
FIG. 16 is a graph showing frequency characteristic of noise characteristic y8 of a 1-bit digital output signal obtained from the output of the multi-bit $\Sigma\Delta$ A/D converter via the oversampling digital filter 22 and the 1-bit $\Sigma\Delta$ converter according to the fifth embodiment.

As the digital 1-bit ΣΔ converter 5 performs ΣΔ modulation of the multi-bit digital signal having the above-described noise characteristic of y7, the noise characteristic of the 1-bit digital signal outputted by the digital 1-bit ΣΔ converter 5 becomes like y8 in FIG. 16.

That is, the noise characteristic of the 1-bit digital signal outputted by the digital 1-bit ΣΔ converter 5 becomes more proximate to the ideal noise characteristic y0 shown in FIG. 3.

Thus, the 1-bit ΣΔ modulation A/D converting device 20 of the fifth embodiment can realize multi-bit A/D conversion with a low sampling frequency but with satisfactory audio band characteristic.

As is described above, in the signal processing device of the present invention, m units of n-bit sigma-delta converters for converting an analog input signal to an n-bit digital signal are connected in parallel in the data converting portion, where n is an integer equal to or greater than 1 and m is an integer equal to or greater than 1. The m units of n-bit digital signals are added by the adding portion. The m×n-bit digital signal from the adding means is converted to a 1-bit digital signal by 1-bit sigma-delta converting portion. Thus, A/D conversion with characteristic proximate to ideal characteristic as designed can be realized.

Also, in the signal processing device of the present invention, an analog input signal is converted to a p-bit digital signal by multi-bit data converting portion, where p is an integer equal to or greater than 2. The p-bit digital signal is converted to a 1-bit digital signal by 1-bit sigma-delta converting portion. Thus, A/D conversion with characteristic proximate to ideal characteristic as designed can be realized.

Further, in the signal processing device of the present invention, an analog input signal is converted to a multi-bit signal of a sampling frequency fs by multi-bit data converting portion. The output of the multi-bit converting portion is processed to a sampling frequency higher than the sampling frequency fs by the oversampling portion. The multi-bit output signal from the oversampling portion is converted to a 1-bit digital signal by 1-bit sigma-delta converting portion. Thus, A/D conversion with characteristic proximate to ideal characteristic as designed can be realized.

In addition, since a multi-bit ΣΔ modulation A/D converter or a multi-bit A/D converter of low sampling frequency can be used, the degree of freedom in A/D conversion can be significantly increased.

What is claimed is:

1. An analog-to-digital converter comprising:

data converting means having m units of n-bit sigma-delta modulators connected in parallel for converting an analog input signal to an n-bit digital signal, where n is an integer equal to or greater than 1 and m is an integer equal to or greater than 1;

adding means for adding m units of n-bit digital signals of the m units of n-bit sigma-delta modulators constituting said data converting means; and a 1-bit sigma-delta modulator for re-converting an addition output from the adding means to a 1-bit digital signal.

2. The analog-to-digital converter as claimed in claim 1, further comprising a digital low-pass filter inserted between the adding means and the 1-bit sigma-delta modulator.

3. An analog-to-digital converter comprising:

multi-bit sigma-delta modulating means for converting an analog input signal to a multi-bit signal; and 1-bit sigma-delta modulating means for converting the multi-bit signal from the multi-bit sigma-delta modulating means to a 1-bit digital signal.

4. The analog-to-digital converter as claimed in claim 3, further comprising an oversampling digital filter between the multi-bit sigma-delta modulating means and the 1-bit sigma-delta modulating means.

* * * * *